(12) United States Patent
Chen et al.

(10) Patent No.: US 8,765,268 B2
(45) Date of Patent: Jul. 1, 2014

(54) COATED ARTICLE AND METHOD FOR MAKING SAID ARTICLE

(75) Inventors: Cheng-Shi Chen, New Taipei (TW); Cong Li, Shenzhen (TW)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 80 days.

(21) Appl. No.: 13/247,045

(22) Filed: Sep. 28, 2011

(65) Prior Publication Data
US 2013/0065078 A1    Mar. 14, 2013

(30) Foreign Application Priority Data
Sep. 9, 2011    (CN) .......................... 2011 1 0267028

(51) Int. Cl.
*B32B 15/04*    (2006.01)
*B32B 15/20*    (2006.01)
*B32B 9/00*    (2006.01)
*F01D 5/14*    (2006.01)

(52) U.S. Cl.
USPC ........... 428/627; 428/632; 428/639; 428/650; 428/656; 428/668; 428/469; 428/698; 428/704; 106/1.15; 106/286.2; 106/286.5; 106/286.8; 416/241 R

(58) Field of Classification Search
None
See application file for complete search history.

(56) References Cited

U.S. PATENT DOCUMENTS

| 4,761,346 | A  | * | 8/1988  | Naik ............................ 428/627 |
| 5,540,981 | A  | * | 7/1996  | Gallagher et al. ............ 428/220 |
| 6,645,351 | B2 | * | 11/2003 | Saint Ramond et al.  204/192.15 |
| 2005/0132717 | A1 | * | 6/2005 | Saint Ramond et al. ....... 60/805 |
| 2008/0231992 | A1 | * | 9/2008 | Cheng et al. .................. 360/122 |
| 2009/0075114 | A1 | * | 3/2009 | Hovsepian et al. ........... 428/650 |

OTHER PUBLICATIONS

STIC search results report—See Attached.*

* cited by examiner

*Primary Examiner* — Gwendolyn Blackwell
*Assistant Examiner* — Seth Dumbris
(74) *Attorney, Agent, or Firm* — Novak Druce Connolly Bove + Quigg LLP

(57) ABSTRACT

A coated article includes a substrate, a composite layer formed on the substrate, and a chromium-oxygen-nitrogen layer formed on the composite layer. The composite layer includes a plurality of nickel-aluminum-holmium layers and a plurality of iridium layers. Each nickel-aluminum-holmium layer interleaves with one iridium layer. A method for making the coated article is also described.

9 Claims, 2 Drawing Sheets

COATED ARTICLE AND METHOD FOR MAKING SAID ARTICLE

BACKGROUND

1. Technical Field

The present disclosure relates to coated articles and a method for making the coated articles.

2. Description of Related Art

Niobium-based alloys have high melting point (higher than 1700° C.), low density (6.6 g/cm$^3$ to 7.2 g/cm$^3$), and high temperature strength and casting properties. However, the oxidation resistance of niobium-based alloys is poor. When in use under high-temperature conditions, the niobium-based alloys may be subject to serious oxidization.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
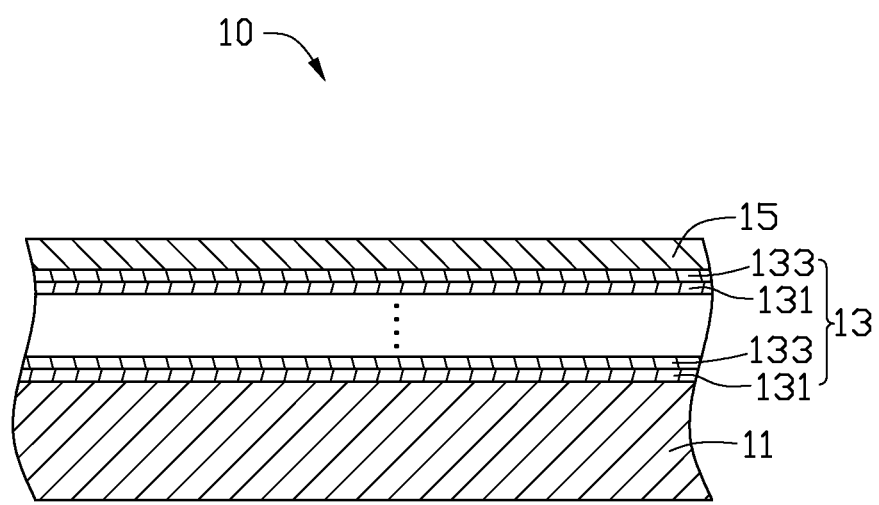
FIG. 1 is a cross-sectional view of an exemplary coated article.

FIG. 1 shows a coated article 10 according to an exemplary embodiment. The coated article 10 includes a substrate 11, a composite layer 13 formed on the substrate 11, and a chromium-oxygen-nitrogen (Cr—O—N) layer 15 formed on the composite layer 13. The composite layer 13 includes a plurality of two or more nickel-aluminum holmium (Ni—Al—Ho) layers 131 and a plurality of two or more iridium (Ir) layers 133 formed on the substrate 11. Each Ni—Al—Ho layer 131 alternates/interleaves with one corresponding iridium layer 133. One of the Ni—Al—Ho layers 131 is directly formed on the substrate 11. Furthermore, one of the iridium layers 133 directly bonds to the outermost Cr—O—N layer 15.

The substrate 11 is made of metal or ceramic, and niobium alloy is preferred.

The total thickness of the composite layer 13 may be about 1.5 μm to about 4.0 μm. The total number of the Ni—Al—Ho layers 131 is equal to the total number of the Ni—Al—Ho layers 131. The total number of the iridium layers 133 may be about 50 layers to about 133 layers. Each Ni—Al—Ho layer 131 may have a thickness of about 15 nm-20 nm. Each iridium layer 133 may have a thickness of about 15 nm-20 nm. Each Ni—Al—Ho layer 131 contains by atomic percentage, about 50% to about 60% of nickel, about 25% to about 30% of aluminum and about 10% to about 25% of holmium.

The Cr—O—N layer 15 have a thickness of about 3 μm to about 5 μm. The Cr—O—N layer 15 contains by atomic percentage, about 80% to about 90% of chromium, about 5% to about 10% of oxygen and about 5% to about 10% of nitrogen.

Figure 2:
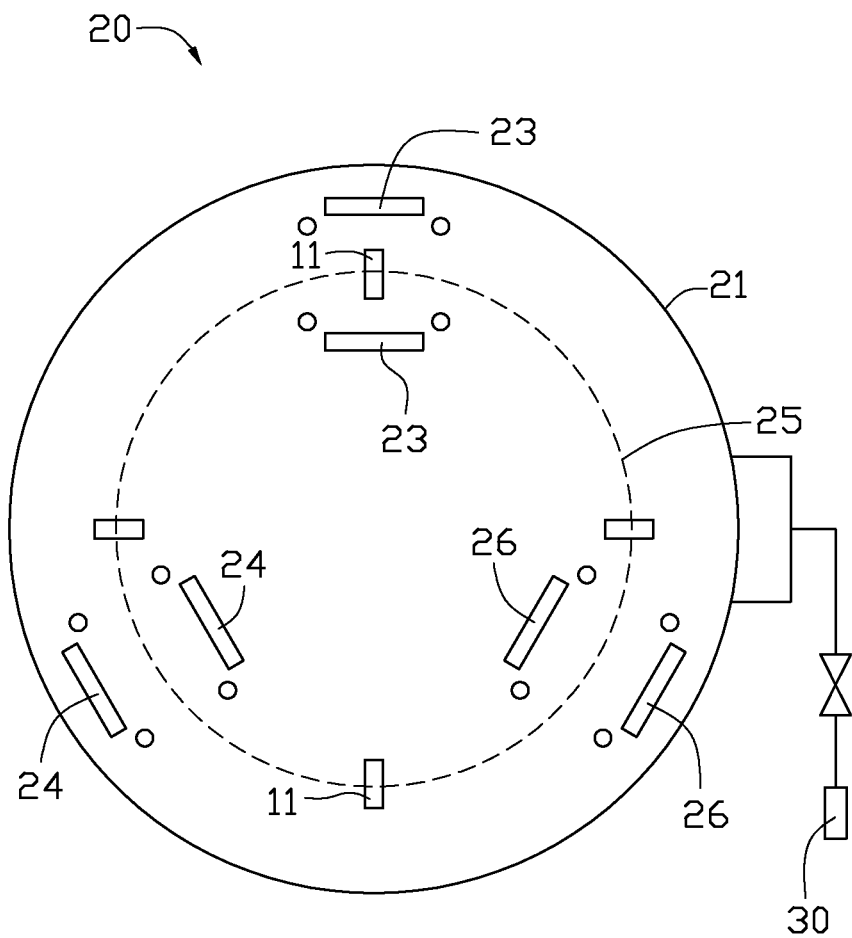
FIG. 2 is a schematic view of a vacuum sputtering device for fabricating the coated article in FIG. 1.

FIG. 2 shows a vacuum sputtering device 20, which includes a vacuum chamber 21 and a vacuum pump 30 connected to the vacuum chamber 21. The vacuum pump 30 evacuates the vacuum chamber 21. The vacuum chamber 21 has nickel-aluminum-holmium alloy targets 23, iridium targets 24, chromium targets 26 and a rotary rack (not shown) positioned. The rotary rack holding the substrate 11 revolves along a circular path 25, and the substrate 11 is also rotated about its own axis while being carried by the rotary rack. The nickel-aluminum-holmium alloy targets 23 contains by atomic percentage, about 50% to about 60% of nickel, about 25% to about 30% of aluminum and about 10% to about 25% of holmium.

A method for making the coated article 10 may include the following steps:

The substrate 11 is pretreated. The pre-treating process may include wiping the surface of the substrate 11 with alcohol and deionized water, to remove impurities such as grease or dirt from the substrate 11. Then, the substrate 11 is dried.

One of the Ni—Al—Ho layers 131 may be vacuum sputtered on the substrate 11. Vacuum sputtering of the Ni—Al—Ho layers 131 is carried out in the vacuum chamber 21. The substrate 11 is positioned on the rotary rack. The vacuum chamber 21 is evacuated to about $8.0 \times 10^{-3}$ Pa and is heated to a temperature of about 100° C. to about 200° C. Ar is used as the sputtering gas and is fed into the vacuum chamber 21 at a flow rate of about 80 sccm to about 150 sccm. The nickel-aluminum-holmium alloy targets 23 are supplied with electrical power of about 10 kw to about 15 kw. A negative bias voltage of about −100 V to about −300 V is applied to the substrate 11. Deposition of the Ni—Al—Ho layer 131 takes about 45 seconds to about 90 seconds.

One of the iridium layers 133 is vacuum sputtered on the Ni—Al—Ho layer 131. Vacuum sputtering of the iridium layers 133 is carried out in the vacuum chamber 21. Nickel-aluminum-holmium alloy targets 23 are powered off and iridium targets 24 are supplied with electrical power of about 8 kw to about 10 kw. The flow rate of Ar, temperature of the vacuum chamber 21 and the negative bias voltage are the same as vacuum sputtering of the Ni—Al—Ho layer 131. Deposition of the iridium layer 133 takes about 45 seconds to about 90 seconds.

The steps of magnetron sputtering the Ni—Al—Ho layer 131 and the iridium layers 133 are equally repeated about 50 to 133 times to form the composite layer 13.

The Cr—O—N layer 15 is vacuum sputtered on the composite layer 13. Vacuum sputtering of the Cr—O—N layer 15 is carried out in the vacuum chamber 21. Iridium targets 24 are powered off and chromium targets 26 are supplied with electrical power of about 8 kw to about 10 kw. Nitrogen ($N_2$) is used as the reaction gas and is fed into the vacuum chamber 21 at a flow rate of about 10 sccm to about 50 sccm. Oxygen ($O_2$) is used as the reaction gas and is fed into the vacuum chamber 21 at a flow rate of about 20 sccm to about 80 sccm. The flow rate of Ar, temperature of the vacuum chamber 21 and the negative bias voltage are the same as vacuum sputtering of the Ni—Al—Ho layer 131. Deposition of the Cr—O—N layer 15 takes about 50 min to about 80 min.

Example 1

The vacuum sputtering device 20 in example 1 was a medium frequency magnetron sputtering device.

The substrate 11 was made of niobium alloy.

Sputtering to form the Ni—Al—Ho layer 131 on the substrate 11 took place, wherein the vacuum chamber 21 was heated to a temperature of about 100° C. Ar was fed into the vacuum chamber 21 at a flow rate of about 80 sccm. The nickel-aluminum-holmium alloy targets 23 contained by atomic percentage, about 50% of nickel, about 25% of aluminum and about 25% of holmium. The nickel-aluminum-holmium alloy targets 23 were supplied with a power of about 10 kw, and a negative bias voltage of about −100 V was applied to the substrate 11. Deposition of the Ni—Al—Ho layer 131 took about 45 seconds.

Sputtering to form the iridium layers 133 on the Ni—Al—Ho layer 131 took place, wherein the iridium targets 24 were supplied with a power of about 8 kw. Other conditions were substantially the same as vacuum sputtering of the Ni—Al—Ho layer 131. The deposition of the iridium layers 133 took about 45 seconds.

The step of sputtering the Ni—Al—Ho layer 131 and the step of sputtering the iridium layers 133 were repeated 133 times. The composite layer had a thickness of about 4 μm.

Sputtering to form the Cr—O—N layer 15 on the composite layer 13 took place, wherein the chromium targets 26 were supplied with a power of about 8 kw. $N_2$ was fed into the vacuum chamber 21 at a flow rate of about 25 sccm. $O_2$ was fed into the vacuum chamber 21 at a flow rate of about 35 sccm. Other conditions were substantially the same as vacuum sputtering of the composite layer 13. The deposition of the Cr—O—N layer 15 took about 50 min. The Cr—O—N layer 15 had a thickness of about 3 μm.

Example 2

The vacuum sputtering device 20 in example 2 was the same in example 1.

The substrate 11 was made of niobium alloy.

Sputtering to form the Ni—Al—Ho layer 131 on the substrate 11 took place, wherein the vacuum chamber 21 was heated to a temperature of about 100° C. Ar was fed into the vacuum chamber 21 at a flow rate of about 80 sccm. The nickel-aluminum-holmium alloy targets 23 contained by atomic percentage, about 60% of nickel, about 25% of aluminum and about 15% of holmium. The nickel-aluminum-holmium alloy targets 23 were supplied with a power of about 10 kw, and a negative bias voltage of about −100 V was applied to the substrate 11. Deposition of the Ni—Al—Ho layer 131 took about 80 seconds.

Sputtering to form the iridium layers 133 on the Ni—Al—Ho layer 131 took place, wherein the iridium targets 24 were supplied with a power of about 9 kw. Other conditions were substantially the same as vacuum sputtering of the Ni—Al—Ho layer 131. The deposition of the iridium layers 133 took about 80 seconds.

The step of sputtering the Ni—Al—Ho layer 131 and the step of sputtering the iridium layers 133 were repeated 100 times. The composite layer had a thickness of about 4 μm.

Sputtering to form the Cr—O—N layer 15 on the composite layer 13 took place, wherein the chromium targets 26 are supplied with a power of about 9 kw. $N_2$ was fed into the vacuum chamber 21 at a flow rate of about 25 sccm. $O_2$ was fed into the vacuum chamber 21 at a flow rate of about 35 sccm. Other conditions were substantially the same as vacuum sputtering of the composite layer 13. The deposition of the Cr—O—N layer 15 took about 50 min. The Cr—O—N layer 15 had a thickness of about 3.2 μm.

The composite layer 13 includes a plurality of alternating Ni—Al—Ho layers 131 and iridium layers 133. The nickel-aluminum-holmium layer 131 has good oxidation resistance. The iridium layer 133 has low penetration rate of oxygen at high temperature, which can effectively delay the diffusion of oxygen to the substrate 11. The Cr—O—N layer 15 has dense structure and can also effectively delay the outside oxygen diffusion to the substrate 11. Thus, the coated article 10 has good high temperature oxidation resistance.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate;
   a composite layer formed on the substrate; and
   a chromium-oxygen-nitrogen layer formed on the composite layer,
   wherein the composite layer comprises an equal number of alternating nickel-aluminum-holmium layers and iridium layers, one of the nickel-aluminum-holmium layers is directly formed on the substrate, one of the iridium layers directly bonds to the chromium-oxygen-nitrogen layer;
   and where the composite layer comprises two or more nickel-aluminum-holmium layers and two or more iridium layers.

2. The coated article as claimed in claim 1, wherein each nickel-aluminum-holmium layer contains about 50% to about 60% of nickel, 25% to about 30% of aluminum, and 10% to about 25% of holmium by atomic percentage.

3. The coated article as claimed in claim 1, wherein the chromium-oxygen-nitrogen contains about 80% to about 90% of chromium, 5% to about 10% of oxygen, and 5% to about 10% of nitrogen by atomic percentage.

4. The coated article as claimed in claim 1, wherein the total number of the nickel-aluminum-holmium layers is about 50 layers to about 133 layers, and the total number of the iridium layers is equal to the total number of the nickel-aluminum-holmium layers.

5. The coated article as claimed in claim 1, wherein the substrate is made of metal or ceramic.

6. The coated article as claimed in claim 1, wherein the composite layer has a thickness of about 1.5 μm to about 4.0 μm.

7. The coated article as claimed in claim 1, wherein each nickel-aluminum-holmium layer has a thickness of about 15 nm to about 20 nm.

8. The coated article as claimed in claim 1, wherein each iridium layer has a thickness of about 15 nm to about 20 nm.

9. The coated article as claimed in claim 1, wherein the chromium-oxygen-nitrogen layer has a thickness of about 3 μm to about 5 μm.

* * * * *